(12) United States Patent
Haishi et al.

(10) Patent No.: US 10,217,543 B2
(45) Date of Patent: Feb. 26, 2019

(54) TRANSPARENT ELECTROCONDUCTIVE FILM AND TOUCH SENSOR IN WHICH SAME IS USED

(71) Applicant: NITTO DENKO CORPORATION, Ibaraki-shi, Osaka (JP)

(72) Inventors: Motoki Haishi, Ibaraki (JP); Naoki Tsuno, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 15/532,197

(22) PCT Filed: Dec. 2, 2015

(86) PCT No.: PCT/JP2015/083900
§ 371 (c)(1),
(2) Date: Jun. 1, 2017

(87) PCT Pub. No.: WO2016/088807
PCT Pub. Date: Jun. 9, 2016

(65) Prior Publication Data
US 2017/0338003 A1    Nov. 23, 2017

(30) Foreign Application Priority Data
Dec. 5, 2014   (JP) .................. 2014-247027

(51) Int. Cl.
*H01B 5/14* (2006.01)
*H01B 3/42* (2006.01)
(Continued)

(52) U.S. Cl.
CPC ............ *H01B 5/14* (2013.01); *B32B 7/02* (2013.01); *B32B 27/08* (2013.01); *B32B 27/325* (2013.01);
(Continued)

(58) Field of Classification Search
CPC .. H01B 5/14; H01B 1/02; H01B 3/426; B32B 27/08; B32B 27/36; B32B 27/365;
(Continued)

(56) References Cited

U.S. PATENT DOCUMENTS 7,060,320 B1    6/2006 Omote et al.
2003/0071794 A1    4/2003 Arakawa et al.
(Continued)

FOREIGN PATENT DOCUMENTS

CN    1273650 A    11/2000
CN    101752025 A    6/2010
(Continued)

OTHER PUBLICATIONS

International Search Report dated Mar. 8, 2016, issued in counterpart application No. PCT/JP2015/083900 (2 pages).
(Continued)

*Primary Examiner* — Nathan L Van Sell
(74) *Attorney, Agent, or Firm* — Westerman, Hattori, Daniels & Adrian, LLP (57) ABSTRACT

Provided are: a transparent electroconductive film with good transparency, wherein the transparent electroconductive film has antiblocking properties that can withstand roll-to-roll manufacturing, and white haze on the transparent electroconductive film side is reduced. Also provided is a touch sensor in which the transparent electroconductive film is used. This transparent electroconductive film includes a transparent substrate 1 and a transparent electroconductive film 13 formed on one side of the transparent substrate, wherein the arithmetic mean surface roughness Ra in a 452×595 μm field of view on the surface of the transparent electroconductive film 13 is greater than 0 nm and no more than 10 nm, and the arithmetic mean surface roughness Ra in a 452×595 μm field of view on the surface of the (Continued)

transparent substrate 1 on which the transparent electroconductive film 13 is not formed is greater than 5 nm and less than 100 nm.

13 Claims, 1 Drawing Sheet

(51) Int. Cl.
    *H01B 1/02*     (2006.01)
    *B32B 27/08*     (2006.01)
    *B32B 27/36*     (2006.01)
    *B32B 27/32*     (2006.01)
    *B32B 7/02*     (2006.01)
    *H03K 17/96*     (2006.01)
    *G06F 3/044*     (2006.01)

(52) U.S. Cl.
    CPC ............ *B32B 27/36* (2013.01); *B32B 27/365* (2013.01); *G06F 3/044* (2013.01); *H01B 1/02* (2013.01); *H01B 3/426* (2013.01); *H03K 17/962* (2013.01); *B32B 2255/10* (2013.01); *B32B 2305/38* (2013.01); *B32B 2307/202* (2013.01); *B32B 2307/412* (2013.01); *B32B 2457/208* (2013.01); *G06F 2203/04103* (2013.01); *G06F 2203/04112* (2013.01); *H03K 2217/960755* (2013.01)

(58) Field of Classification Search
    CPC ............ B32B 27/325; B32B 2307/202; B32B 2307/412; B32B 2255/10; B32B 2457/208; B32B 2305/38; H03K 17/962; G06F 3/044
    See application file for complete search history.

(56) References Cited

U.S. PATENT DOCUMENTS

| | | | | |
|---|---|---|---|---|
| 2006/0204671 A1* | 9/2006 | Ogawa | ............... | B29D 11/0073 427/495 |
| 2009/0104440 A1* | 4/2009 | Nashiki | ................... | C08J 7/045 428/336 |
| 2009/0310219 A1* | 12/2009 | Nagahama | ............. | G02B 1/118 359/488.01 |
| 2010/0143634 A1 | 6/2010 | Yasui et al. | | |
| 2010/0289762 A1* | 11/2010 | Ito | .............................. | B32B 7/02 345/173 |
| 2011/0261443 A1* | 10/2011 | Isojima | ................. | C03C 17/002 359/360 |
| 2012/0111718 A1 | 5/2012 | Haishi et al. | | |
| 2012/0114923 A1 | 5/2012 | Haishi et al. | | |
| 2013/0133933 A1 | 5/2013 | Tsuno et al. | | |
| 2013/0157010 A1 | 6/2013 | Takada et al. | | |
| 2013/0288047 A1 | 10/2013 | Kajihara et al. | | |
| 2014/0106131 A1 | 4/2014 | Ikai et al. | | |
| 2016/0086683 A1 | 3/2016 | Hara et al. | | |

FOREIGN PATENT DOCUMENTS

| | | |
|---|---|---|
| JP | 2003-45234 A | 2/2003 |
| JP | 2012-114070 A | 6/2012 |
| JP | 2012-246570 A | 12/2012 |
| JP | 2013-107349 A | 6/2013 |
| JP | 2013-145547 A | 7/2013 |
| JP | 2013-243115 A | 12/2013 |
| JP | 2014-95896 A | 5/2014 |
| TW | 201438921 A | 10/2014 |
| WO | 2012/086484 A1 | 6/2012 |
| WO | 2014/084008 A1 | 6/2014 |
| WO | 2014/115770 A1 | 7/2014 |
| WO | 2014/188822 A1 | 11/2014 |

OTHER PUBLICATIONS

Notification of Transmittal of Translation of the International Preliminary Report on Patentability (Form PCT. IB/338) issued in counterpart International Application No. PCT/JP2015/083900 dated Jun. 15, 2017 with Forms PCT/IB/373 and PCT/ISA/237. (7 pages).
Office Action dated May 8, 2018, issued in counterpart Chinese Application No. 201580065737.4, with English translation (16 pages).
Office Action dated Sep. 20, 2018, issued in counterpart Japanese Application No. 2014-247027, with English machine translation. (6 pages).
Office Action dated Dec. 5, 2018 issued in counterpart Korean Application No. 10-2017-7016931, with English translation. (9 pages).
Office Action dated Dec. 29, 2018, issued in counterpart Chinese Application No. 201580065737.4, with partial English translation. (5 pages).

* cited by examiner

TRANSPARENT ELECTROCONDUCTIVE FILM AND TOUCH SENSOR IN WHICH SAME IS USED

TECHNICAL FIELD

The present invention relates to a transparent electroconductive film including a transparent substrate and a transparent electroconductive coating formed on the surface of the transparent substrate, and a touch sensor in which the same is used. In particular, the present invention is a technique useful for performing roll-to-roll manufacturing.

BACKGROUND ART

As a transparent electroconductive member, so-called electroconductive glass including glass having formed thereon an indium oxide thin film is conventionally known. However, since glass is used as a substrate, the electroconductive glass has poor flexibility and processability, and cannot be applied in some cases according to uses. Therefore, in recent years, transparent electroconductive films using plastic film substrates including a polyethylene terephthalate substrate or the like are widely used for advantages, e.g., impact resistance and light weight, in addition to flexibility and processability.

When a transparent electroconductive coating is formed on the surface of the plastic film substrate, or a transparent electroconductive film is processed, roll-to-roll manufacturing is known to be used. When the roll-to-roll manufacturing is used, the surface of a laminated body including the substrate and the transparent electroconductive coating, or the like needs to be roughened to some extent in order to prevent sticking (blocking) between the films when being wound. For example, sliding properties and antiblocking properties have been improved by a technique for adding particles to a substrate itself, applying a resin containing optional particles onto the surface of the substrate, or forming fine irregularities in the surface of the substrate, or the like (see Patent Document 1).

However, when the fine irregularities are formed in the plastic film substrate, light scattering due to the irregularities causes an increase in the haze of the transparent electroconductive film, which impairs transparency. Such a transparent electroconductive film is used for a transparent electrode in a new display method such as a liquid crystal display or an electroluminescence display, and a touch panel or the like, which disadvantageously causes deterioration in the display quality of the display or the like.

On the other hand, Patent Document 2 discloses a transparent electroconductive film as a technique for decreasing haze to improve transparency. The transparent electroconductive film includes a film substrate, a cured resin layer, and an indium-based composite oxide layer. The cured resin layer includes spherical particles having a predetermined range size and a binder resin layer having a predetermined range thickness. However, in the technique of Patent Document 2, antiblocking properties and sliding properties or the like are not considered.

Patent Document 3 discloses a transparent electroconductive film having antiblocking properties and good transparency. The transparent electroconductive film includes a transparent polymer substrate, a transparent electroconductive layer, and a cured resin layer. An outermost layer on a side on which the cured resin layer is formed includes a surface having a flat part and a raised part provided thereon. The raised part has a predetermined range height. However, in the technique of Patent Document 3, Ra in the wide field of view of the surface on which the transparent electroconductive coating is formed is increased, which allows of a further improvement in haze.

PRIOR ART DOCUMENTS

Patent Documents

Patent Document 1: JP-A-2003-45234
Patent Document 2: JP-A-2013-145547
Patent Document 3: JP-A-2014-95896

DISCLOSURE OF THE INVENTION

Problems to be Solved by the Invention

Then, it is an object of the present invention to provide a transparent electroconductive film having good transparency, wherein the transparent electroconductive film has antiblocking properties that can withstand roll-to-roll manufacturing, and haze on a transparent electroconductive coating side is reduced, and a touch sensor in which the transparent electroconductive film is used.

Means for Solving the Problems

In order to solve the problems, the present inventors intensively studied and, as a result, found out that the objects can be attained by adopting the following configuration, which resulted in completion of the present invention.

That is, a transparent electroconductive film of the present invention includes: a transparent substrate; and a transparent electroconductive coating formed on one side of the transparent substrate, wherein arithmetic mean surface roughness Ra in a 452 μm×595 μm field of view on a surface of the transparent electroconductive coating is more than 0 nm and 10 nm or less; and arithmetic mean surface roughness Ra in a 452 μm×595 μm field of view on a surface of the transparent substrate on which the transparent electroconductive coating is not formed is more than 5 nm and less than 100 nm. Various physical property values in the present invention are measured by methods adopted in Examples or the like.

The arithmetic mean surface roughness Ra in the wide field of view of the surface of the transparent electroconductive coating is decreased to the range, and the arithmetic mean surface roughness Ra in the wide field of view on the side on which the transparent electroconductive coating of the transparent substrate is not formed is increased to the range, which can maintain antiblocking properties that can withstand roll-to-roll manufacturing, and improve transparency on a transparent electroconductive coating side and the visibility of a display device such as a touch panel. This mechanism is considered as follows. A conventional technique (roughening a surface) for preventing blocking causes deterioration (white haze) in display quality when using the transparent electroconductive film for the touch panel or the like. That is, the cause of the deterioration in the display quality is considered to be the scattering of light caused by the roughness of the surface of the transparent substrate and the final transparent electroconductive laminated body. Furthermore, after advancing the consideration, it becomes clear that roughness on a side on which the transparent electroconductive coating is formed, i.e., roughness on a side on which a high refractive-index layer is formed largely contributes to deterioration in display quality (development of white haze). From this finding, the roughness on the side on which the transparent electroconductive coating is formed is suppressed low, and the side opposite to the side on which the transparent electroconductive coating is formed is roughened, which more certainly realizes antiblocking properties, and results in an improvement in display quality.

The transparent substrate in the present invention preferably includes a first cured resin layer, a transparent resin film, and a second cured resin layer formed in this order. The first cured resin layer is located on the side on which the transparent electroconductive coating is formed. Since the cured resin layer is provided on each of both the surfaces of the transparent resin film, the arithmetic mean surface roughnesses Ra of the surfaces can be separately adjusted, which advantageously realizes the operation effect. Excellent abrasion resistance can be exhibited, and the visibility of a display device such as a touch panel can be improved.

In the transparent electroconductive film of the present invention, the transparent electroconductive coating is preferably an indium-based composite oxide. The transparent electroconductive coating is the indium-based composite oxide, which facilitates the crystallization of the transparent electroconductive coating provided by a heat treatment to allow the transparent electroconductive coating having higher transparency and being excellent to be formed.

The transparent electroconductive coating in the present invention is preferably a crystalline layer converted by a heat treatment of an amorphous transparent electroconductive coating formed on the transparent substrate. This can provide the transparent electroconductive film having low resistance, and improve transparency and the visibility of a display device such as a touch panel.

In the transparent electroconductive film of the present invention, a thickness of the transparent electroconductive coating is preferably 15 nm to 50 nm. Thereby, the transparent electroconductive film having excellent transparency can be efficiently manufactured, and the visibility of a display device such as a touch panel can be improved. The transparent electroconductive film can have a thin shape, and is suitable for an electrostatic capacitance-type touch panel.

The transparent electroconductive coating in the present invention preferably includes a metal mesh or a metal nanowire. The transparent electroconductive coating including the metal mesh or the metal nanowire, can provide the transparent electroconductive film having a high total light transmittance and improve the visibility of a display device such as a touch panel.

The transparent resin film in the present invention preferably includes a polyester-based resin, a polycarbonate-based resin, or a cycloolefin-based resin. This can provide the transparent electroconductive film having good mechanical characteristics and processability, and improve transparency and the visibility of a display device such as a touch panel.

In the transparent electroconductive film of the present invention, a thickness of the transparent substrate is preferably 10 μm to 200 μm. By setting the thickness of the transparent substrate to the range, the transparent electroconductive film having high transparency and excellent appearance quality can be manufactured, and ease of feeding in roll-to-roll manufacturing can be improved.

The second cured resin layer in the present invention preferably includes a plurality of spherical particles and a binder resin layer for fixing the plurality of spherical particles to the transparent resin film; and a difference w-d between a mode particle size w and a thickness d of the binder resin layer is more than 0 and 1.2 μm or less, where w is a mode particle size of the spherical particles and d is a thickness of the binder resin layer. This can more certainly realize antiblocking properties that can withstand roll-to-roll manufacturing.

A touch sensor of the present invention preferably includes the transparent electroconductive film. The transparent electroconductive film can maintain antiblocking properties that can withstand the roll-to-roll manufacturing, and improve transparency on a transparent electroconductive coating side and the visibility of a display device such as a touch panel.

MODE FOR CARRYING OUT THE INVENTION

Embodiments of a transparent electroconductive film of the present invention will be described below with reference to the drawings. In some or all of the figures, parts that are unnecessary for the description are not given, and there are parts shown by magnifying or minifying, etc. in order to make the description easy. The terms each denoting a positional relationship such as the terms "upper" and "lower" are merely used in order to make the description easy, and each never has an intention of limiting the configuration of the present invention.

<Transparent Electroconductive Film>

Figure 1:
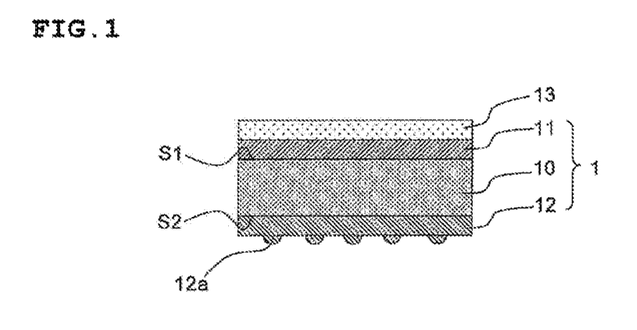
FIG. 1 is a schematic sectional view of a transparent electroconductive film according to one embodiment of the present invention.
Figure 3:
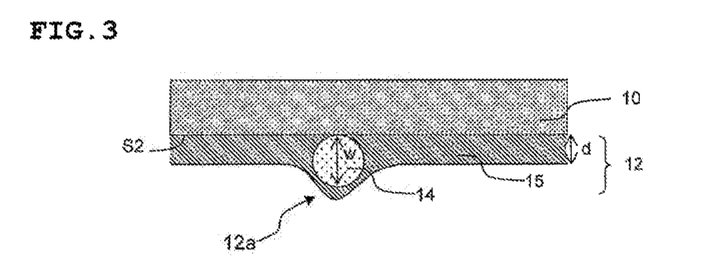
FIG. 3 is a partially enlarged view showing the configuration of a second cured resin layer in FIG. 1 or FIG. 2.

FIG. 1 is a schematic sectional view of a transparent electroconductive film according to one embodiment of the present invention. The transparent electroconductive film of FIG. 1 includes a transparent substrate 1 and a transparent electroconductive coating 13. The transparent substrate 1 includes a transparent resin film 10, a first cured resin layer 11 formed on a first main surface S1 of the transparent resin film 10, and a second cured resin layer 12 formed on a second main surface S2 side opposite to the first main surface S1 of the transparent resin film 10. The second cured resin layer 12 includes a plurality of spherical particles 14 and a binder resin layer 15 for fixing the spherical particles to the surface of the transparent resin film 10, as shown in FIG. 3. Since the second cured resin layer 12 includes a convex part 12a provided on the surface, blocking between the transparent electroconductive films can be suppressed when the transparent electroconductive film is wound by roll-to-roll manufacturing. The transparent substrate 1 may include only the transparent resin film 10, or may include the transparent resin film 10 and the first cured resin layer or the second cured resin layer, but the transparent substrate 1 preferably includes the first cured resin layer 11, the transparent resin film 10, and the second cured resin layer 12 in this order on a side on which the transparent electroconductive coating 13 is formed.

Figure 2:
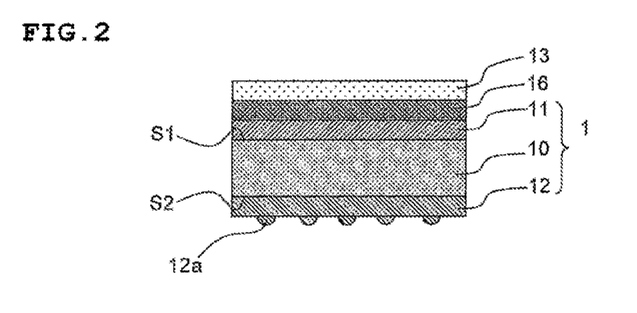
FIG. 2 is a schematic sectional view of a transparent electroconductive film according to another embodiment of the present invention.

FIG. 2 is a schematic sectional view of a transparent electroconductive film according to another embodiment of the present invention. In the transparent electroconductive film according to this embodiment, an optical adjustment layer 16 is provided between the first cured resin layer 11 and the transparent electroconductive coating 13 of the transparent substrate 1. The other configurations are the same as those of the transparent electroconductive film described with reference to FIG. 1.

(Transparent Resin Film)

The transparent resin film is not particularly limited, and various kinds of plastic films having transparency are used. Examples of the material thereof include a polyester-based resin, a cycloolefin-based resin, a polycarbonate-based resin, an acetate-based resin, a polyether sulfone-based resin, a polyamide-based resin, a polyimide-based resin, a polyolefin-based resin, a (meth)acryl-based resin, a polyvinyl chloride-based resin, a polyvinylidene chloride-based resin, a polystyrene-based resin, a polyvinyl alcohol-based resin, a polyarylate-based resin, and a polyphenylene sulfide-based resin. From the viewpoint of providing good visibility, among them, particularly preferable are a polyester-based resin, a cycloolefin-based resin, and a polycarbonate-based resin.

The polyester-based resin is preferably a polyethylene terephthalate-based resin and a polyethylene naphthalate-based resin or the like from the viewpoint of mechanical characteristics and heat resistance.

The cycloolefin-based resin is not particularly limited as long as the resin is a resin having units of a monomer made of a cyclic olefin (cycloolefin). The cycloolefin-based resin may be either a cycloolefin polymer (COP) or a cycloolefin copolymer (COC). The cycloolefin copolymer means an amorphous cyclic olefin-based resin which is a copolymer of a cyclic olefin and olefin such as ethylene.

As the cyclic olefin, a polycyclic cyclic olefin and a monocyclic cyclic olefin exist. Examples of the polycyclic cyclic olefin include norbornene, methyl norbornene, dimethyl norbornene, ethyl norbornene, ethylidene norbornene, butyl norbornene, dicyclopentadiene, dihydrodicyclopentadiene, methyl dicyclopentadiene, dimethyl dicyclopentadiene, tetracyclododecene, methyltetracyclododecene, dimethylcyclotetradodecene, tricyclopentadiene, and tetracyclopentadiene. Examples of the monocyclic cyclic olefin include cyclobutene, cyclopentene, cyclooctene, cyclooctadiene, cyclooctatriene, and cyclododecatriene.

The transparent resin film including the cycloolefin-based resin is available also as a commercially available product. Examples of the transparent resin film include "ZEONOR" manufactured by Zeon Corporation, "ARTON" manufactured by JSR Corporation, "TOPAS" manufactured by Polyplastics Co., Ltd., and "APEL" manufactured by Mitsui Chemicals, Inc.

Examples of a commercially available product of the polycarbonate-based resin include "PURE-ACE" manufactured by TEIJIN LIMITED and "ELMECH" manufactured by Kaneka Corporation.

From the viewpoint of manufacturing a transparent electroconductive film having high transparency and excellent appearance quality, or the like, and improving ease of feeding in roll-to-roll manufacturing, the thickness of the transparent resin film or the transparent substrate is preferably 10 µm or more and 200 µm or less, and more preferably 30 µm or more and 100 µm or less.

The surface of the transparent resin film may be subjected previously to an etching treatment or an undercoating treatment such as sputtering, corona discharge, flame, ultraviolet ray irradiation, electron beam irradiation, chemical conversion, or oxidation to improve adhesion with each cured resin layer formed on the transparent resin film. The surface of the transparent resin film may be freed of dust and cleaned by solvent cleaning or ultrasonic cleaning or the like as necessary before the cured resin layer is formed.

(Cured Resin Layer)

A transparent resin film itself including a polyester-based resin, a cycloolefin-based resin, or a polycarbonate-based resin or the like tends to be apt to be highly scratched. Since a transparent resin film is apt to be scratched in each step such as formation of the transparent electroconductive coating, patterning of the transparent electroconductive coating, or mounting of the transparent resin film on electronic equipment, or the like, the first cured resin layer and the second cured resin layer are preferably formed as cured resin layers on both the surfaces of the transparent resin film.

Each of the cured resin layers is a layer obtained by curing a curing type resin. Any of resins using heat curing, active energy ray curing, or both thereof as a curing mechanism may be adopted as the curing type resin. A crosslinking agent, an initiator, or a sensitizer or the like may be used together with the curing type resin as necessary. The thicknesses of the first cured resin layer and the second cured resin layer are preferably 0.5 µm to 5 µm independently, more preferably is 0.7 µm to 3 µm, and most preferably is 0.8 µm to 2 µm. The first cured resin layer and the second cured resin layer are obtained by applying a resin composition containing each curing type resin, and a crosslinking agent, an initiator, and a sensitizer or the like added as necessary onto a transparent resin film, drying a solvent when a resin composition contains the solvent, and curing the resin composition under the application of heat, active energy rays, or both thereof. Known means such as an air circulation type oven and an IR heater can be used as heat, but the heat is not limited to these methods. Examples of the active energy rays include ultraviolet rays, electron beam, and gamma rays without particular limitation. The curing type resin is preferably an acryl-based resin and an epoxy-based resin, and more preferably an acryl-based resin.

The first cured resin layer 11 or the second cured resin layer 12 preferably includes a plurality of spherical particles 14 and a binder resin layer 15 for fixing the spherical particles to the surface of the transparent resin film 10. In particular, the second cured resin layer 12 more preferably includes the plurality of spherical particles 14 and the binder resin layer 15. FIG. 3 is a partially enlarged view showing the configuration of the second cured resin layer 12 in FIG. 1 or FIG. 2. The second cured resin layer 12 includes a plurality of spherical particles 14 and a binder resin layer 15 for fixing the spherical particles 14 to the surface of the transparent resin film 10. The mode particle size of the spherical particles 14 is described as w, and the thickness of the binder resin layer 15 is described as d. On an outer surface of the second cured resin layer 12, i.e., on a surface on a side which is not in contact with the transparent resin film 10, a portion where the spherical particle 14 exists is convex, and protrudes approximately by a size of the difference w−d. A portion where the spherical particle 14 does not exist is generally planar. Apart of the binder resin layer 15 is thinly formed on the upper surface of each of the spherical particles 14. Herein, the "mode particle size" means a particle diameter indicating a maximum value of particle distribution. The "thickness of the binder resin layer" means a thickness of the flat portion where the spherical particle does not exist. In the second cured resin layer 12, for a relationship between the mode particle size w of the spherical particles 14 and the thickness d of the binder resin layer 15, w−d is preferably more than 0 and 1.2 µm or less, more preferably 0.1 µm to 1.0 µm, and still more preferably 0.3 µm to 0.9 µm. Thereby, antiblocking properties that can withstand roll-to-roll manufacturing can be more certainly realized while an influence on haze is suppressed.

Arithmetic mean surface roughness Ra in a 452 μm×595 μm field of view on a surface of the first cured resin layer is preferably more than 0 nm and 10 nm or less, more preferably more than 0 nm and 9 nm or less, and still more preferably more than 0 nm and 7 nm or less from the viewpoint of improving transparency.

Arithmetic mean surface roughness Ra in a 452 μm×595 μm field of view on a surface of the second cured resin layer is preferably more than 5 nm and 100 nm or less, more preferably more than 7 nm and 70 nm or less, and still more preferably more than 10 nm and 60 nm or less. When the arithmetic mean surface roughness Ra is within the range, antiblocking properties that can withstand roll-to-roll manufacturing can be improved.

The arithmetic mean surface roughness Ra on the second cured resin layer side is preferably rougher than the arithmetic mean surface roughness Ra on the first cured resin layer side. This can provide antiblocking properties that can withstand roll-to-roll manufacturing and reduce haze on the transparent electroconductive coating side. A difference between the arithmetic mean surface roughness Ra in the 452 μm×595 μm field of view on the surface of the second cured resin layer and the arithmetic mean surface roughness Ra in the 452 μm×595 μm field of view on the surface of the first cured resin layer is preferably 5 nm or more, more preferably 10 nm or more, and still more preferably 15 nm or more.

For the spherical particles, those having transparency, such as various kinds of metal oxides, glass, and plastic can be used without particular limitation. Examples thereof include inorganic particles made of silica, alumina, titanium, zirconia, and calcium oxide or the like, crosslinked or uncrosslinked organic particles made of various kinds of polymers such as polymethyl methacrylate, polystyrene, polyurethane, an acryl-based resin, an acryl-styrene copolymer, benzoguanamine, melamine and polycarbonate, and silicone-based particles. One kind or two or more kinds of particles can be appropriately selected from the aforementioned particles, and used, but organic particles are preferred. As the organic particles, an acryl-based resin is preferred from the viewpoint of sphericity and heat resistance.

The content of the spherical particles in the first cured resin layer is preferably 0.0000 to 0.0020 parts by weight, more preferably 0.0000 to 0.0015 parts by weight, and still more preferably 0.0000 to 0.0010 parts by weight based on 100 parts by weight of the solid content of the resin composition. The content of the spherical particles in the second cured resin layer is preferably 0.0010 to 0.0300 parts by weight, more preferably 0.0015 to 0.0200 parts by weight, and still more preferably 0.0020 to 0.0150 parts by weight based on 100 parts by weight of the solid content of the resin composition. When the content of the spherical particles in the first cured resin layer or the second cured resin layer is within the range, the arithmetic mean surface roughnesses Ra of both the surfaces can be separately adjusted. Thereby, abase raised part sufficient for applying antiblocking properties and easy sliding properties is likely to be formed, and the haze of the transparent electroconductive film caused by light scattering due to the spherical particles is decreased, which tends to improve visibility.

Any material can be selected as a material of a binder resin used for the binder resin layer as long as the spherical particles can be fixed. For example, the binder resin is obtained by curing a curable resin composition by ultraviolet rays or electron beam. The curable resin composition preferably contains a multifunctional acrylate polymer such as pentaerythritol and dipentaerythritol, a polymer obtained by addition reaction of an acrylic acid to a glycidyl acrylate polymer, and a polymeric initiator.

(Transparent Electroconductive Coating)

The transparent electroconductive coating is preferably a coating made of a metal oxide. A metal oxide of at least one metal selected from the group consisting of indium, tin, zinc, gallium, antimony, titanium, silicon, zirconium, magnesium, aluminum, gold, silver, copper, palladium, and tungsten is suitably used. The metal oxide may further contain metal atoms shown in the group as necessary. Among them, indium-tin composite oxide (ITO) and indium-zinc composite oxide are preferred. Other than these metal oxides, indium oxide ($In_2O_3$) doped with metallic ions (IV) or metallic ions (II) is used. Such an indium composite oxide layer has a high transmissivity of 80% or more in the visible light range (380 nm to 780 nm) and a low surface resistance value per unit area (300Ω/☐ or less: ohms per square).

The surface resistance value of the indium composite oxide layer is preferably 300Ω/☐ or less, and more preferably 270Ω/☐ or less. Such a transparent electroconductive film having a small surface resistance value can be obtained by, for example, forming an amorphous layer of the indium composite oxide on a cured resin layer by a sputtering method or a vacuum evaporation method, and thereafter applying a heat treatment of 120° C. to 200° C. for about 30 to 90 minutes to change the amorphous layer into a crystalline layer. This converting means is not particularly limited, and an air circulation type oven and an IR heater or the like are used.

(Definition of Crystalline)

The transparent electroconductive film in which the transparent electroconductive coating is formed on the transparent substrate is immersed in hydrochloric acid having a concentration of 5% by weight at 20° C. for 15 minutes, and then washed with water and dried. The resistance between terminals at an interval of 15 mm is measured by a tester. It is determined that the crystallization of the ITO coating into crystalline has been completed, when the resistance between the terminals at an interval of 15 mm is not excessive of 10 kΩ.

The thickness of the transparent electroconductive coating is preferably 15 nm to 50 nm, more preferably 20 nm to 40 nm, and still more preferably 25 nm to 35 nm. When the thickness of the transparent electroconductive coating 13 is less than 15 nm, the electric resistance of the coating surface increases, and a continuous coating is hard to be formed. When the thickness of the transparent electroconductive coating 13 is more than 50 nm, deterioration in transparency, or the like may be caused. The transparent electroconductive coating 13 may have a structure in which a plurality of transparent electroconductive coatings having different compositions are laminated.

Arithmetic mean surface roughness Ra in a 452×595 μm field of view on the surface of the transparent electroconductive coating is preferably more than 0 nm and 10 nm or less, more preferably more than 0 nm and 9 nm or less, and still more preferably more than 0 nm and 7 nm or less from the viewpoint of improving transparency. A difference between the arithmetic mean surface roughness Ra in the 452 μm×595 μm field of view on the surface of the second cured resin layer and the arithmetic mean surface roughness Ra in the 452 μm×595 μm field of view on the surface of the transparent electroconductive coating is preferably 5 nm or more, more preferably 10 nm or more, and still more preferably 15 nm or more.

The transparent electroconductive coating can include a metal nanowire or a metal mesh.

(Metal Nanowire)

The metal nanowire is made of a metal, and refers to an electroconductive substance that has a needle- or thread-like shape and has a diameter of nanometer scale. The metal nanowire may be linear or may be curved. When a transparent electroconductive layer including the metal nanowire is used, the metal nanowire is formed into a net-like shape. Accordingly, even when a small amount of the metal nanowire is used, a good electrical conduction path can be formed, and hence a transparent electroconductive film having small electrical resistance can be obtained. Furthermore, the metal nanowire is formed into a net-like shape, and hence an opening part is formed in a gap of the net. As a result, a transparent electroconductive film having a high light transmittance can be obtained.

Any appropriate metal can be used as a metal constituting the metal nanowire as long as the metal has high electroconductivity. Examples of the metal constituting the metal nanowire include silver, gold, copper, and nickel. A material obtained by subjecting the metal to metal plating (e.g., gold plating) may be used. Among them, silver, copper, or gold is preferred from the viewpoint of electroconductivity, and silver is more preferred.

(Metal Mesh)

The transparent electroconductive coating including the metal mesh is obtained by forming a thin metal wire into a lattice pattern on the transparent substrate. The same metal as the metal constituting the metal nanowire can be used. The transparent electroconductive coating including the metal mesh can be formed by any appropriate method. The transparent electroconductive coating can be obtained by, for example, applying a photosensitive composition (composition for forming a transparent electroconductive coating) containing a silver salt onto the transparent substrate, and then subjecting the resultant to an exposure treatment and a developing treatment to form the thin metal wire into a predetermined pattern.

(Optical Adjustment Layer)

As shown in FIG. 2, the transparent electroconductive film can further include at least one optical adjustment layer 16 between the first cured resin layer 11 and the transparent electroconductive coating 13. When the transmissivity of the transparent electroconductive film is increased or the transparent electroconductive coating 13 is patterned, the optical adjustment layer 16 is used in order to obtain a transparent electroconductive film decreasing a transmissivity difference and a reflectance difference between a pattern part in which a pattern remains and an opening part in which no pattern remains to provide excellent visibility.

The optical adjustment layer is formed of an inorganic substance, an organic substance, or a mixture of an inorganic substance and an organic substance. Examples of the material that forms the optical adjustment layer include inorganic substances such as NaF, $Na_3AlF_6$, LiF, $MgF_2$, $CaF_2$, $SiO_2$, $LaF_3$, $CeF_3$, $Al_2O_3$, $TiO_2$, $Ta_2O_5$, $ZrO_2$, ZnO, ZnS, and $SiO_x$ (x is 1.5 or more and less than 2), and organic substances such as an acryl resin, an urethane resin, a melamine resin, an alkyd resin, and a siloxane-based polymer. As the organic substance, in particular, it is preferred to use a thermosetting resin formed of a mixture of a melamine resin, an alkyd resin, and an organic silane condensate. The optical adjustment layer can be formed by a coating method such as a gravure coating method or a bar coating method, a vacuum deposition method, a sputtering method, and an ion plating method or the like using the material described above.

The thickness of the optical adjustment layer is preferably 10 nm to 200 nm, more preferably 20 nm to 150 nm, and still more preferably 20 nm to 130 nm. When the thickness of the optical adjustment layer is too small, a continuous coating is hard to be formed. When the thickness of the optical adjustment layer is too large, deterioration in the transparency of the transparent electroconductive film tends to be caused, or cracks tend to be apt to occur in the optical adjustment layer.

The optical adjustment layer may have nano-fine particles having an average particle diameter of 1 nm to 500 nm. The content of nano-fine particles in the optical adjustment layer is preferably 0.1% by weight to 90% by weight. The average particle diameter of nano-fine particles that are used for the optical adjustment layer is preferably 1 nm to 500 nm as described above, and more preferably 5 nm to 300 nm. The content of nano-fine particles in the optical adjustment layer is more preferably 10% by weight to 80% by weight, and still more preferably 20% by weight to 70% by weight. By including nano-fine particles in the optical adjustment layer, the refractive index of the optical adjustment layer itself can be easily adjusted.

Examples of the inorganic oxide that forms nano-fine particles include fine particles of silicon oxide (silica), hollow nano-silica, titanium oxide, aluminum oxide, zinc oxide, tin oxide, zirconium oxide, and niobium oxide or the like. Among them, fine particles of silicon oxide (silica), titanium oxide, aluminum oxide, zinc oxide, tin oxide, zirconium oxide, and niobium oxide are preferred. These may be used alone, or used in combination of two or more thereof.

(Protective Film)

From the viewpoint of preventing the fracture of the transparent electroconductive film, a protective film can be laminated on the transparent electroconductive film with a pressure-sensitive adhesive layer to be described later sandwiched therebetween to provide a transparent electroconductive laminated body. The protective film includes a polyester-based resin. The above first cured resin layer and second cured resin layer are provided on both the surfaces of the transparent resin film, so that the transparent resin film itself is less likely to be scratched, but by forming both the cured resin layers, the transparent electroconductive laminated body is hard, and is apt to be split. When the transparent resin film is a long substrate, for example, fracture is disadvantageously apt to occur in the transparent resin film when the film travels in a step of forming the transparent electroconductive coating and a step of patterning the transparent electroconductive coating, or the like. The polyester-based resin film constituting the protective film is preferably subjected to a drawing treatment such as a uniaxial drawing treatment or a biaxial drawing treatment from the viewpoint of improving mechanical strength. The polyester-based resin film is preferably subjected to a biaxial drawing treatment from the viewpoint of improving mechanical strength and heat resistance properties. Examples of the polyester-based resin include a polyethylene terephthalate-based resin and a polyethylene naphthalate-based resin, and a polyethylene terephthalate-based resin is preferred from the viewpoint of mechanical characteristics, optical characteristics, and ease of acquisition.

(Pressure-Sensitive Adhesive Layer)

A material for forming a pressure-sensitive adhesive layer can be used without particular limitation as long as the material has transparency. The material is preferably an acryl-based pressure-sensitive adhesive, an epoxy-based pressure-sensitive adhesive, and a silicone-based pressure-sensitive adhesive, and more preferably an acryl-based pressure-sensitive adhesive. The drying thickness of the pressure-sensitive adhesive layer to be formed can be appropriately adjusted, and is usually about 1 to 40 µm, preferably 3 to 35 µm, and more preferably 5 to 30 µm. The protective film can be laminated on the transparent electroconductive film with the pressure-sensitive adhesive layer sandwiched therebetween to produce a transparent electroconductive laminated body, which can provide a reduced influence of haze in haze measurement on the transparent electroconductive coating side.

<Touch Sensor>

A touch sensor of the present invention includes the transparent electroconductive film described above, and is used in a form of a touch panel or a touch key or the like. For example, the transparent electroconductive film can be suitably applied to an electrostatic capacitance-type touch panel or the like.

For forming a touch panel, another substrate such as glass or a polymer film may be bonded onto any one or both of the main surfaces of the transparent electroconductive film with a transparent pressure-sensitive adhesive layer sandwiched therebetween. For example, a laminated body may be formed, which is obtained by bonding a transparent substrate onto a surface on which the transparent electroconductive coating 13 of the transparent electroconductive film is not formed, with a transparent pressure-sensitive adhesive layer sandwiched therebetween. The transparent substrate may be made of a single substrate film, or a laminate of two or more substrate films (for example, a laminate body in which substrate films are laminated onto each other with a transparent pressure-sensitive adhesive layer sandwiched therebetween). A hard coat layer may be provided on the external surface of the transparent substrate that is bonded onto the transparent electroconductive film.

When the transparent electroconductive film according to the present invention is used for formation of a touch panel, the transparent electroconductive film has excellent handling property during formation of the touch panel. Therefore, touch panels having excellent transparency and visibility can be produced with high productivity.

EXAMPLES

The present invention will be described in detail below with Examples, but the present invention is not limited to Examples below as long as the spirit of the present invention is maintained.

Example 1

(Formation of Cured Resin Layer)

A spherical particle-containing curable resin composition was prepared, which contained 100 parts by weight of an ultraviolet-curable resin composition (manufactured by DIC Corporation, product name: "UNIDIC (registered trademark) RS29-120") and 0.002 parts by weight of acryl-based spherical particles (manufactured by Soken Chemical & Engineering Co., Ltd., product name: "MX-180TA") having a mode particle size of 1.9 µm. An applied layer was formed by applying the prepared spherical particle-containing curable resin composition to one surface of a long polycycloolefin film (manufactured by Zeon Corporation, product name: "ZEONOR (registered trademark)" having a thickness of 50 µm. Then, a second cured resin layer having a thickness of 1.0 µm was formed by irradiating the applied layer with ultraviolet rays from a side on which the applied layer was formed. A first cured resin layer having a thickness of 1.0 µm was formed on the other surface of the polycycloolefin film in the same manner as in the above except that the first cured resin layer included no spherical particles.

(Formation of Transparent Electroconductive Coating)

Next, the polycycloolefin film having each surface on which the cured resin layer was formed was input into a winding type sputtering device, to form an amorphous indium-tin oxide layer having a thickness of 27 nm on the surface of the first cured resin layer.

Then, the polycycloolefin film on which the amorphous indium-tin oxide layer was formed was input into an air circulation type oven by roll-to-roll manufacturing. In the air circulation type oven, the polycycloolefin film was subjected to a heat treatment at 130° C. for 90 minutes to convert the amorphous transparent electroconductive coating into the crystalline transparent electroconductive coating, thereby producing a transparent electroconductive film including the transparent electroconductive coating having a surface resistance value of 100Ω/□.

Example 2

A transparent electroconductive film was produced in the same manner as in Example 1 except that a first cured resin layer was formed by adding 0.001 parts by weight of the acryl-based spherical particles in Example 1, and a second cured resin layer was formed by adding 0.001 parts by weight of the acryl-based spherical particles.

Example 3

A transparent electroconductive film was produced in the same manner as in Example 1 except that a second cured resin layer was formed by adding 0.006 parts by weight of the acryl-based spherical particles in Example 1.

Example 4

A transparent electroconductive film was produced in the same manner as in Example 1 except that a second cured resin layer was formed by adding 0.010 parts by weight of the acryl-based spherical particles in Example 1.

Example 5

A transparent electroconductive film was produced in the same manner as in Example 1 except that a second cured resin layer was formed by adding 0.015 parts by weight of the acryl-based spherical particles in Example 1.

Example 6

A transparent electroconductive film was produced in the same manner as in Example 1 except that an organic-inorganic hybrid resin (manufactured by JSR Corporation, product name: OPSTAR 27412 (registered trademark), solid content: 20%, solvent: 80%) containing zirconium dioxide particles having an average particle diameter of 30 nm and an acryl-based resin binder was formed as an optical adjustment layer on a first cured resin layer in Example 1.

Comparative Example 1

A transparent electroconductive film was produced in the same manner as in Example 1 except that a second cured resin layer was formed without adding the acryl-based spherical particles in Example 1.

Comparative Example 2

A transparent electroconductive film was produced in the same manner as in Example 1 except that a first cured resin layer was formed by adding 0.002 parts by weight of the acryl-based spherical particles in Example 1, and a second cured resin layer was formed by adding 0.006 parts by weight of the acryl-based spherical particles.

Comparative Example 3

A transparent electroconductive film was produced in the same manner as in Example 1 except that a first cured resin layer was formed by adding 0.004 parts by weight of the acryl-based spherical particles in Example 1, and a second cured resin layer was formed by adding 0.004 parts by weight of the acryl-based spherical particles.

<Evaluations>
(1) Measurement of Thickness

A thickness of less than 1.0 jam was measured by observing the cross section of the transparent electroconductive film using a transmission electron microscope (manufactured by Hitachi, Ltd., product name: "H-7650"). A thickness of 1.0 µm or more was measured using a coating thickness meter (manufactured by Peacock, digital dial gauge DG-205).

(2) Measurement of Mode Particle Size

Measurement was made under a predetermined condition (Sheath liquid: ethylacetate; measurement mode: HPF measurement mode; measuring method: total count) using a flow-type particle image analyzing device (manufactured by Sysmex Corporation, product name: "FPTA-3000S"). The sample used was spherical particles diluted with ethylacetate to 1.0% by weight and uniformly dispersed using an ultrasonic cleaning machine.

(3) Measurement of Arithmetic Mean Surface Roughness Ra

Arithmetic mean surface roughness in a wide field of view (452 µm×595 µm) was measured at a magnification of 10 using an optical profilometer (manufactured by Veeco Instruments Inc., product name: "WYCO"). Arithmetic mean surface roughness in a narrow field of view (1 µm×1 µm) was measured using an atomic force microscope (manufactured by Digital Instruments, product name: "Nanoscope IV"). The evaluation results are shown in Table 1.

(4) Evaluation of Antiblocking Properties

The transparent electroconductive film was placed on a glass substrate (manufactured by Matsunami Glass Ind., Ltd., film thickness: 1.3 mm) so that the second cured resin layer side of the transparent electroconductive film was on the glass substrate side. A weight of 500 g was placed on the transparent electroconductive film for 10 seconds to measure times (seconds) until all Newton's rings (Moire pattern between an adhesion part and a peeled part between the transparent electroconductive film and the glass substrate) disappeared. The evaluation basis will be shown below. The evaluation results are shown in Table 1.

<Evaluation Basis>
○: 30 seconds or less, good antiblocking properties
x: more than 30 seconds, poor antiblocking properties (5) Measurement of Haze By attaching an acryl-based pressure-sensitive adhesive-attached protective film having a refractive index of 1.47 to the surface of the second cured resin layer, an irregularity on the surface of the second cured resin layer was filled with an acryl-based pressure-sensitive adhesive. Thereby, a sample was produced, which had a reduced influence of haze due to the irregularity of an opposite surface (second cured resin layer side) to a surface to be measured (ITO side). The haze of the surface (ITO side) of the transparent electroconductive film of this sample was measured using Direct reading haze computer (manufactured by Suga Test Instruments Co., Ltd., product name: "HGM-ZDP"). The evaluation results are shown in Table 1.

(6) Measurement of Surface Resistance Value

Measurement was made by a four-terminal method in conformity with JIS K7194.

TABLE 1

|  | Arithmetic mean surface roughness Ra (nm) Wide field of view | | Arithmetic mean surface roughness Ra (nm) Narrow field of view | | | |
| --- | --- | --- | --- | --- | --- | --- |
|  | Transparent electroconductive coating side | Second cured resin layer side | Transparent electroconductive coating side | Second cured resin layer side | Antiblocking properties | Evaluation of haze (%) |
| Example 1 | 5.6 | 12.4 | 0.2 | 0.2 | ○ | 0.2 |
| Example 2 | 8.2 | 8.3 | 0.2 | 0.2 | ○ | 0.2 |
| Example 3 | 5.0 | 22.8 | 0.2 | 0.2 | ○ | 0.3 |
| Example 4 | 5.2 | 37.5 | 0.2 | 0.2 | ○ | 0.2 |
| Example 5 | 5.1 | 52.0 | 0.2 | 0.2 | ○ | 0.3 |
| Example 6 | 5.5 | 12.2 | 2.1 | 0.2 | ○ | 0.2 |
| Comparative Example 1 | 5.1 | 5.0 | 0.2 | 0.2 | x | 0.2 |
| Comparative Example 2 | 12.3 | 21.4 | 0.2 | 0.2 | ○ | 0.5 |
| Comparative Example 3 | 18.4 | 18.0 | 0.2 | 0.2 | ○ | 0.8 |

(Results and Considerations)

In Examples 1 to 6, the antiblocking properties of the transparent electroconductive film fed by the roll-to-roll manufacturing were good, which provided a reduction in haze. On the other hand, in Comparative Example 1, haze could be reduced, but Ra in a wide field of view on the second cured resin layer side was small, which caused insufficient antiblocking properties. In Comparative Examples 2 and 3, antiblocking properties were improved, but Ra in a wide field of view on the transparent electroconductive coating side was large, which could not provide a reduction in haze.

DESCRIPTION OF REFERENCE SIGNS

1: transparent substrate
10: transparent resin film
11: first cured resin layer
12: second cured resin layer
12a: convex part (on surface of second cured resin layer)
13: transparent electroconductive coating
14: spherical particles
15: binder resin layer
16: optical adjustment layer
S1: first main surface (of transparent resin film)
S2: second main surface (of transparent resin film)
w: mode particle size of spherical particles
d: thickness of binder resin layer

The invention claimed is:

1. A transparent electroconductive film comprising:
a transparent substrate; and
a transparent electroconductive coating formed on one side of the transparent substrate,
wherein
the transparent substrate has a second cured resin layer on its one surface on which the transparent electroconductive coating is not formed, the second cured resin layer including particles;
arithmetic mean surface roughness Ra in a 452 μm×595 μm field of view on a surface of the transparent electroconductive coating is more than 0 nm and 10 nm or less;
arithmetic mean surface roughness Ra in a 452 μm×595 μm field of view on a surface of the second cured resin layer of the transparent substrate on which the transparent electroconductive coating is not formed is more than 5 nm and less than 100 nm; and
a difference between the arithmetic mean surface roughness Ra in the 452 μm×595 μm field of view on the surface of the second cured resin layer and the arithmetic mean surface roughness Ra in the 452 μm×595 μm field of view on the surface of the transparent electroconductive coating is 5 nm or more.

2. The transparent electroconductive film according to claim 1,
wherein
the transparent substrate includes a first cured resin layer, a transparent resin film, and the second cured resin layer formed in this order; and
the first cured resin layer is located on the side on which the transparent electroconductive coating is formed.

3. The transparent electroconductive film according to claim 1, wherein the transparent electroconductive coating is an indium-based composite oxide.

4. The transparent electroconductive film according to claim 3, wherein the transparent electroconductive coating is a crystalline layer converted by a heat treatment of an amorphous transparent electroconductive coating formed on the transparent substrate.

5. The transparent electroconductive film according to claim 3, wherein a thickness of the transparent electroconductive coating is 15 nm to 50 nm.

6. The transparent electroconductive film according to claim 1, wherein the transparent electroconductive coating includes a metal mesh or a metal nanowire.

7. The transparent electroconductive film according to claim 2, wherein the transparent resin film includes a polyester-based resin, a polycarbonate-based resin, or a cycloolefin-based resin.

8. The transparent electroconductive film according to claim 1, wherein a thickness of the transparent substrate is 10 μm to 200 μm.

9. The transparent electroconductive film according to claim 2,
wherein
the second cured resin layer includes a plurality of spherical particles and a binder resin layer for fixing the plurality of spherical particles to the transparent resin film; and
a difference w–d between a mode particle size w and a thickness d of the binder resin layer is more than 0 and 1.2 μm or less, where w is a mode particle size of the spherical particles and d is a thickness of the binder resin layer.

10. A touch sensor comprising the transparent electroconductive film according to claim 1.

11. The transparent electroconductive film according to claim 1, wherein the transparent substrate includes a first cured resin layer having a spherical particle content of 0.0000 to 0.0020 parts by weight based on 100 parts by weight of the solid content of the resin composition of the first cured resin layer, and the second cured resin layer having a spherical particle content of 0.0010 to 0.0300 parts by weight based on 100 parts by weight of the solid content of the resin composition of the second cured resin layer.

12. The transparent electroconductive film according to claim 1, wherein the transparent substrate includes a first cured resin layer having a spherical particle content of 0.0000 to 0.0015 parts by weight based on 100 parts by weight of the solid content of the resin composition of the first cured resin layer and the second cured resin layer having a spherical particle content of 0.0015 to 0.0200 parts by weight based on 100 parts by weight of the solid content of the resin composition of the second cured resin layer.

13. The transparent electroconductive film according to claim 1, wherein the transparent substrate includes a first cured resin layer having a spherical particle content of 0.0000 to 0.0010 parts by weight based on 100 parts by weight of the solid content of the resin composition of the first cured resin layer and a second cured resin layer having a spherical particle content of 0.0020 to 0.0150 parts by weight based on 100 parts by weight of the solid content of the resin composition of the second cured resin layer.

* * * * *